(12) United States Patent
Preikszas et al.

(10) Patent No.: US 8,063,364 B2
(45) Date of Patent: Nov. 22, 2011

(54) PARTICLE OPTICAL DEVICE WITH MAGNET ASSEMBLY

(75) Inventors: Dirk Preikszas, Oberkochen (DE); Michael Steigerwald, Westhausen (DE); Daniel Tobias, Jena (DE); Andreas Eisele, Munich (DE); Momme Mommsen, Aalen (DE); Dietmar Doenitz, Aalen (DE); Christian Hendrich, Aalen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 141 days.

(21) Appl. No.: 12/644,760

(22) Filed: Dec. 22, 2009

(65) Prior Publication Data

US 2010/0155597 A1    Jun. 24, 2010

(30) Foreign Application Priority Data

Dec. 23, 2008    (DE) .................... 10 2008 062 888

(51) Int. Cl.
*H01J 49/42* (2006.01)
*H01J 1/50* (2006.01)
*G01N 23/22* (2006.01)

(52) U.S. Cl. . 250/309; 250/310; 250/311; 250/396 ML; 335/210

(58) Field of Classification Search .................. 250/298, 250/309–311, 396 ML, 306 R, 402.1, 402.21, 250/492.3; 335/209, 210, 296, 297, 299, 335/502
See application file for complete search history.

(56) References Cited

U.S. PATENT DOCUMENTS

| | | | |
|---|---|---|---|
| 3,394,254 A | 7/1968 | LePoole | |
| 3,673,528 A * | 6/1972 | Hughes | 335/210 |
| 3,885,192 A * | 5/1975 | Esterson et al. | 315/3.5 |
| 3,958,147 A * | 5/1976 | Triplett | 315/3.5 |
| 4,740,704 A | 4/1988 | Rose et al. | |
| 4,812,652 A | 3/1989 | Egle et al. | |
| 5,177,361 A | 1/1993 | Krahl et al. | |
| 5,736,743 A | 4/1998 | Benveniste | |
| 6,015,973 A | 1/2000 | Nunome | |
| 6,040,576 A | 3/2000 | Benner | |
| 6,384,412 B1 | 5/2002 | Krahl et al. | |
| 6,483,110 B1 | 11/2002 | Kaneyama | |

(Continued)

FOREIGN PATENT DOCUMENTS

DE    102 35 455    2/2004

(Continued)

OTHER PUBLICATIONS

H.-C. Kan et al., "Comparison of stigmatically focusing magnetic prisms of square versus round symmetries", J. Vac. Sci. Technol. B 20(6), 2002, pp. 2519-2525.

(Continued)

*Primary Examiner* — Bernard E Souw

(74) *Attorney, Agent, or Firm* — Fish & Richardson P.C.

(57) ABSTRACT

A particle optical apparatus has a particle source for generating at least one beam of charged particles, and a magnet arrangement having two pole plates, which are arranged spaced apart from one another, such that the at least one beam of charged particles in operation passes through the pole plates, wherein trenches are provided in the pole plates, in which trenches coil wires are arranged. The trenches, when viewed in a cross section transverse to an extension direction of the trenches, have a smaller width in a region of a surface of the pole plates, than in a region arranged at a distance from the surface.

26 Claims, 6 Drawing Sheets

U.S. PATENT DOCUMENTS

| | | | |
|---|---|---|---|
| 6,855,939 B2 | 2/2005 | Rose et al. | |
| 7,078,713 B2 * | 7/2006 | White | 250/492.21 |
| 7,750,775 B2 * | 7/2010 | Iseno | 335/296 |
| 2002/0074494 A1 * | 6/2002 | Lundquist et al. | 250/307 |
| 2004/0061067 A1 | 4/2004 | Clauss | |
| 2004/0084629 A1 | 5/2004 | Preikszas et al. | |
| 2004/0211914 A1 | 10/2004 | Buijsse | |
| 2005/0109956 A1 * | 5/2005 | Lundquist et al. | 250/492.22 |

FOREIGN PATENT DOCUMENTS

| | | |
|---|---|---|
| DE | 102 35 981 | 2/2004 |
| EP | 1 388 882 | 2/2004 |
| JP | 11054080 | 2/1999 |
| WO | WO 2007/060017 | 5/2007 |

OTHER PUBLICATIONS

German Office action, with English translation, for corresponding DE Application No. 10 2008 064 696.2, dated Jan. 17, 2011.

Telieps et al., "An analytical reflection and emission UHV surface electron microscope", Ultramicroscopy 17 (1985), pp. 61-68.

\* cited by examiner

PARTICLE OPTICAL DEVICE WITH MAGNET ASSEMBLY

CROSS-REFERENCE TO RELATED APPLICATION

This applications claims priority under 35 U.S.C. §119 to German Patent Application DE 10 2008 062 888.3, filed Dec. 23, 2008, the entire contents of which are hereby incorporated by reference.

FIELD

The present disclosure relates to a particle optical device, and in particular to an electron microscope, having a magnet assembly.

BACKGROUND

Electron microscopes are used for examining an object by directing a primary electron beam towards the object to be examined, whereupon electrons emanating from the object are guided to a detector as a secondary electron beam, and detected there.

For electron microscopes, it is generally desirable to deflect the primary and/or the secondary electron beam in a precise manner, e.g. about an angle of 10° or more; or to separate an electron beam from a counter-propagating electron beam, for being able to separately manipulate these beams. For an electron microscope operating in 180°-deflection, or an electron microscope with a mirror corrector, this typically means that both beams have to pass a deflecting field of a beam separator.

For beam guiding, magnetic fields are usually employed, which often have to fulfill high demands concerning their homogeneity, stability and edge effects. Metal plates with a high magnetic conductivity, usually of an iron-nickel-alloy, can be placed at a fixed distance opposite from one another as pole plates for generating these magnetic fields. Coils are fitted into the surfaces of the pole plates, which coils may be energized by a flow of current. A magnetic field which is homogeneous to a high degree of approximation is then generated on the areas surrounded by the coil wires. Such a device is known from German Patent No. 102 35 981.

The demands on the stability and accuracy of the geometry of the pole plates can be quite high, in particular for the electron microscopes with a mirror corrector mentioned above.

SUMMARY

Conventionally, the heat generated by energizing the coils is dissipated through the pole plates. The present inventors have now found that thereby, temperature gradients are caused, which affect the geometry of the pole plates. Additionally, temperature drifts may result, when the amount of energizing has to be changed. These influences result in undesirable variations of the deflecting field.

The present disclosure can overcome such drawbacks and deficiencies.

The present disclosure provides a particle optical device with
   a particle source for generating at least one beam of charged particles, and
   a magnet assembly including two pole plates, which are arranged spaced apart from one another, so that in operation, the beam of charged particles passes between the two pole plates, wherein trenches are provided in the pole plates, in which trenches coil wires are arranged.

Generally, the concept contemplated in this application resides in reducing and/or in stabilizing the generation of heat in the coils, and/or in reducing the transfer of heat from the coils into the pole plates.

According to a first aspect, a particle optical device is provided, in which the coil trenches have a smaller width in surface regions of the pole plate, than in regions located at a distance from the surface.

Thereby, more space is provided in some embodiments for the total cross section of the coil wires, without substantially compromising the particle optical properties of the pole plates essentially determined by their surface contours. The heat generation for a like energizing current is reduced by the larger cross section of the conductor, and the accordingly lower (electric) resistance.

The enlargement of the trench cross section can, in some embodiments, be effected inwardly, outwardly or in both radial directions in relation to the conductor loop.

According to a second aspect, a particle optical device including a coil mount is provided, on which coil mount the coil wires are supported, wherein a gap is provided between the coil mount and the pole plate.

According to this structure, in some embodiments the heat transfer from the coil wires to the pole plates via heat conduction is reduced, particularly in a case where the pole plates and the coils are located in a vacuum. The heat dissipation from the coils may occur around the pole plates or through holes provided therein, respectively, e.g. using pillar-like stands made of a heat conducting material and extending through the holes.

In some embodiments, such an arrangement allows that generated heat is conducted to a cooling device bypassing the pole plates.

According to a third aspect, a particle optical device including two layers of an electrically conducting and non-magnetic material is provided, which layers are arranged between the two pole plates, and which extend on either side of the beam of charged particles.

According to some embodiments, an environment for the beam may be provided, to which a high voltage can be applied, while the sample and the coils are on ground or near-ground potential. While the current supply for the coils is simple, an electrical voltage may in operation be applied e.g. to parts of the sample, and the electron energy at the sample is variable. The nominal electron energy between the pole plates, however, remains constant, and likewise the magnetic field needed for deflection and therefore the energizing current. As a consequence, the remaining heat input into the pole plates through heat loss of the coils (e.g. via heat radiation) remains constant and, thus, temperature drift is reduced.

According to a fourth aspect, a particle optical device is provided, in which the coil wires are isolated thermally and with respect to high voltage from the pole plates, and the latter are put on a higher electric potential than the coil wires.

According to some embodiments, this results that on the one hand, the coil wires do not undergo thermal variations, and on the other hand, that the heat input into the pole plates is small. In some embodiments, this structure can be combined with that according to the first aspect, such that the desire for increased space in the coil trench may not result in a reduced cross section of the coil wires.

According to a fifth aspect, a particle optical device having a permanent magnet is provided, which is located within the coil arrangement as projected onto the beam plane.

According to some embodiments, this arrangement results in the main portion of the magnetic field to be generated being provided by the permanent magnet, while only a comparatively smaller portion is provided by the coil arrangement. Thereby, the current flow through the coils, and accordingly the heat input into the pole plates is reduced, and as a result also the influence on the pole plate geometry.

In some embodiments, a magnetic flow density of the material used for the permanent magnet is particularly little influenced by the temperature. This small dependency on the temperature can, in embodiments, be compensated for using a control e.g. measuring the temperature and applying a corresponding correction current to the coils as described e.g. in German patent No. 102 35 455.

Generally, two or more or all of the above aspects may be combined with one another.

Hereinabove, the particle optical device is not restricted to electrons, but also ions, myons or others may serve as the charged particles. A preferred application of the particle optical device, however, is in the field of electron microscopy.

The particle optical device may be used in several different types of electron microscopes. These comprise, on the one hand, such devices in which the primary electron beam is an examining beam focused onto specific locations on the object, in particular focused successively onto distinct locations, and wherein a secondary electron intensity is detected integrally, i.e. is not spatially resolved. These types of microscopes are known in the art as SEMs (Scanning Electron Microscope). On the other hand, the devices comprise electron microscopes with a spatially resolving detector onto which an extended area of the object is imaged, wherein the extended area is simultaneously and essentially uniformly illuminated by the primary electron beam. These types of microscopes are known in the art, among others, as LEEM (low energy electron microscope), SEEM (secondary electron emission microscope) or TEM (transmission electron microscope).

BRIEF DESCRIPTION OF THE DRAWINGS

The forgoing as well as other advantageous features of the disclosure will be more apparent from the following detailed description of exemplary embodiments of the disclosure with reference to the accompanying drawings, wherein

FIG. 5b shows schematically a similar magnet arrangement as the one of FIG. 5a;

The modifications shown in FIGS. 5 to 9 can be combined in some embodiments.

DETAILED DESCRIPTION OF EXEMPLARY EMBODIMENTS

Figure 1:
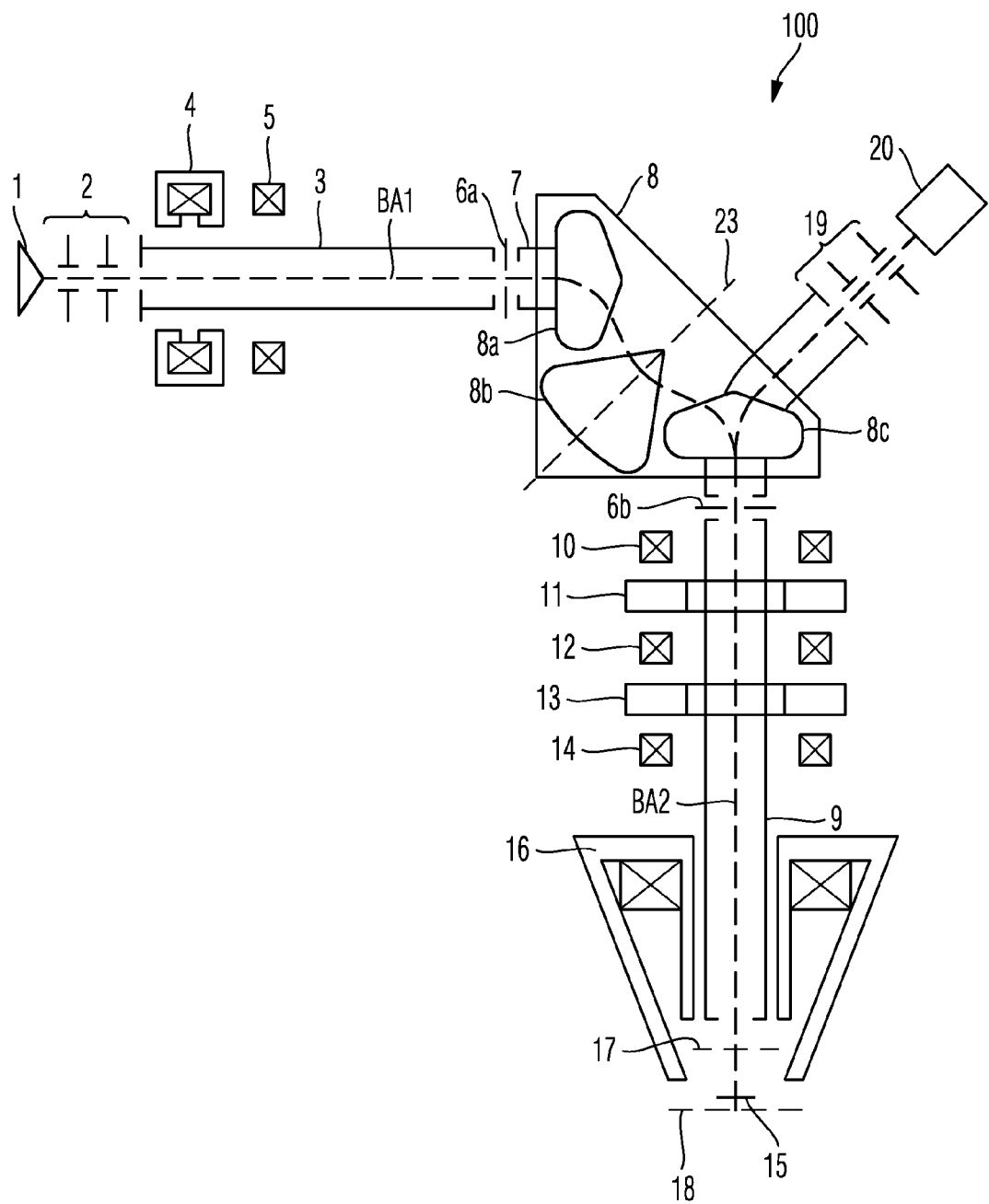
FIG. 1 shows schematically a conventional electron microscope of the SEM type.

The operating principle of an electron microscope of the SEM type is explained in FIG. 1. The electron microscope 100 includes a particle source 1 with a beam accelerator 2 following the particle source 1 in the direction of the beam. After passing through the beam accelerator 2, the particles are accelerated to the potential of the outer beam guide tube 3. In this region, a magnetic condenser lens 4 and a stigmator 5 following same are envisaged. A first electrostatic immersion lens 6a follows the stigmator 5, by which lens 6a the electrons are accelerated or decelerated, respectively, to another kinetic energy, namely that of the inner beam guide tube 7. The beam splitter 8 with its magnet sectors 8a to 8c is arranged in the region of the inner beam guide tube 7. The beam splitter 8 is followed by a second electrostatic immersion lens 6b, by which the electrons are decelerated or accelerated, respectively, to the energy of the objective beam tube 9. Following this in the direction of the beam, a multipole system including 12-pole-elements 11, 13 and deflecting systems 10, 12, 14 are arranged, as well as, close to the object 15, an objective lens 16 having a diffraction plane 17. The objective lens 16 focuses the incident electron beam onto the focal plane 18 of the objective lens 16. Herein, the objective lens 16 can be configured as a purely magnetic objective lens, or as a combination with an electrostatic immersion lens. In the latter case, the immersion lens is formed by letting the objective beam tube 9 end within the objective lens 16 at a position of the pole shoe gap or behind, and by decelerating the electrons to the potential of the object 15 positioned in the vicinity of the focal plane 18 after exiting from the objective beam tube 9.

The pair of immersion lenses 6a, 6b further allows for compensating variations of the electron energy, such that the electron beam passing through the beam splitter 8 has a substantially constant energy.

The secondary electrons generated through interaction of the primary electron beam with the object 15 are accelerated back by the higher potential of the objective beam tube 9 and pass through the beam path between the objective lens 16 and the beam splitter 8 in opposite direction. Due to their reversed direction of motion, the electrons are deflected in the magnet sector 8c in the opposite direction, so that they are spatially separated from the primary electron beam. The secondary electrons can be detected by a detector 20 following the deflected branch of the beam splitter. A discrimination regarding the energies of the electrons coming from the sample, in particular according to mirror electrons, back scattered electrons, and several kinds of secondary electrons, is possible by an electrostatic lens 19 placed in front, to which different potentials are applied.

Figure 2:
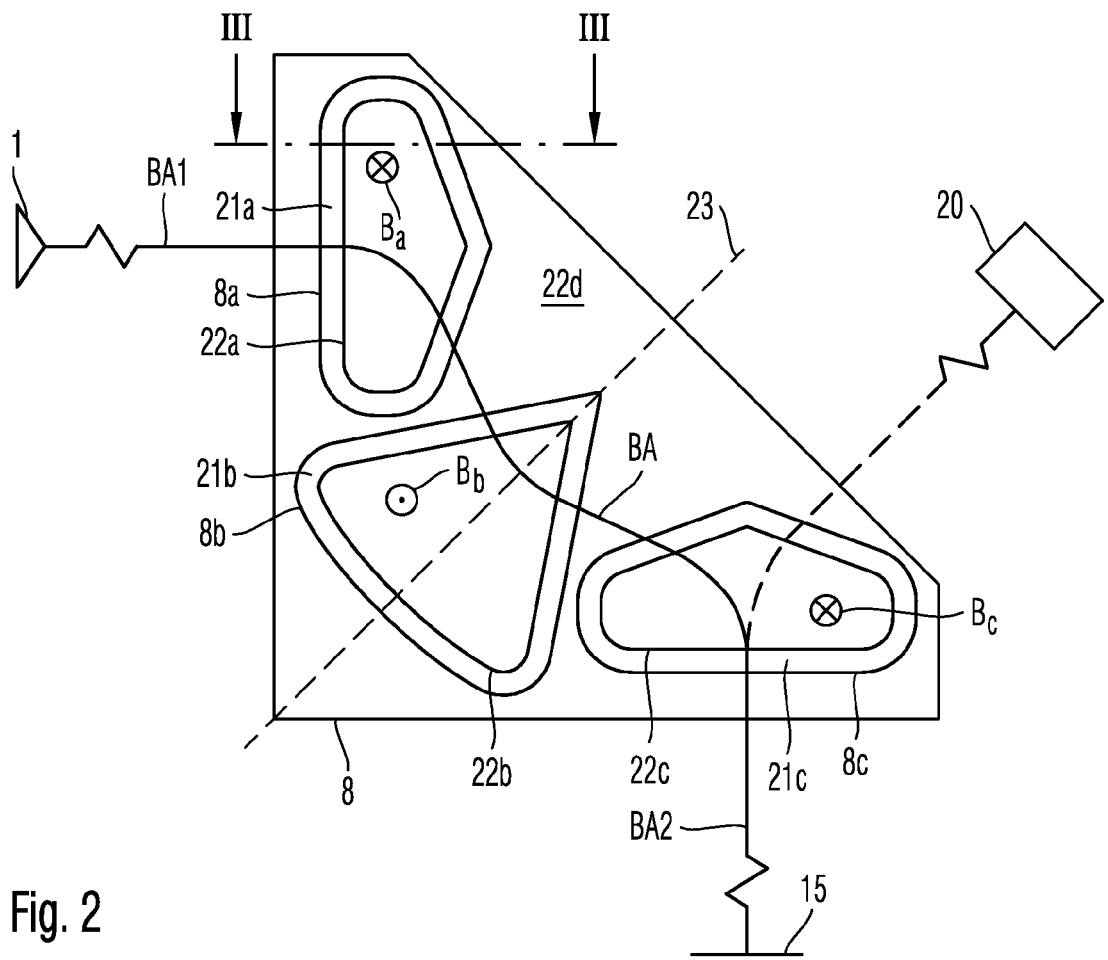
FIG. 2 shows schematically an arrangement of field regions of the beam splitter according to FIG. 1.

FIG. 2 elucidates the arrangement of beam regions and field regions in the beam splitter 8. This exemplary beam splitter 8 consists of overall three magnet sectors 8a, 8b, 8c with surrounding current conductors (not shown) which are uniformly bent as regards the direction of the bends, and are placed in according conductor guides 21a, 21b, 21c. The two outer sectors 8a, 8c may have identical structure, but it is sufficient if this symmetry holds for those beam regions transsected by the primary electron beam. The directions of the magnetic fields $B_a$ and $B_c$, in embodiments also their strengths, are the same in these outer sectors 8a, 8c, while the magnetic field $B_b$ of the inner sector 8b has the opposite direction. The inner magnetic sector 8b is symmetrical in itself, and arranged symmetrically to the plane 23 indicated by the dashed line in FIG. 2. Accordingly, the field regions including the field-free regions are symmetrically arranged, and therefore likewise the beam regions transsected by the beam. In addition, all the magnetic fields are parallel or antiparallel, respectively, so that the primary electron beam passes coplanarly through the beam splitter, namely in the beam plane 24 (see FIG. 3). FIG. 2 thus represents a projection onto the beam plane 24.

The beam deflection within the beam splitter 8 results in a beam deflection of about 90° in this example, between the first and second beam axes BA1, BA2.

Figure 3:
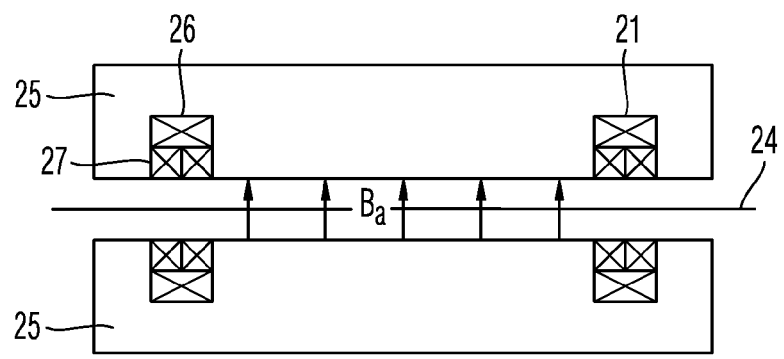
FIG. 3 shows schematically a cross section through one field region of the beam splitter shown in FIGS. 1 and 2 with an example of a current conductor arrangement.

FIG. 3 illustrates the principal design of the magnet sectors 81, 8b, 8c. This drawing corresponds to a cross sectional view of the magnet sector 8a shown in FIG. 2, approximately along the line (III-III). The pole shoes 25 and the pair of coils 26 arranged in the conductor guide 21 are shown, as well as pairs of trim coils 27 serving for fine adjustment. In the space enclosed by the coils 26, the magnetic field $B_a$ is generated. Yokes magnetically connecting the pole shoes 25 outside of the region surrounded by the current conductor, and involved for completing the magnetic field flow, are not shown. Further, the yokes define the distance between the pole shoes. Both pole shoes 25 and the yokes may be made of soft iron, ferrite, an iron-nickel-alloy or another magnetic material. The coil wires may be made of a high conductance copper alloy or the like.

Figure 4:
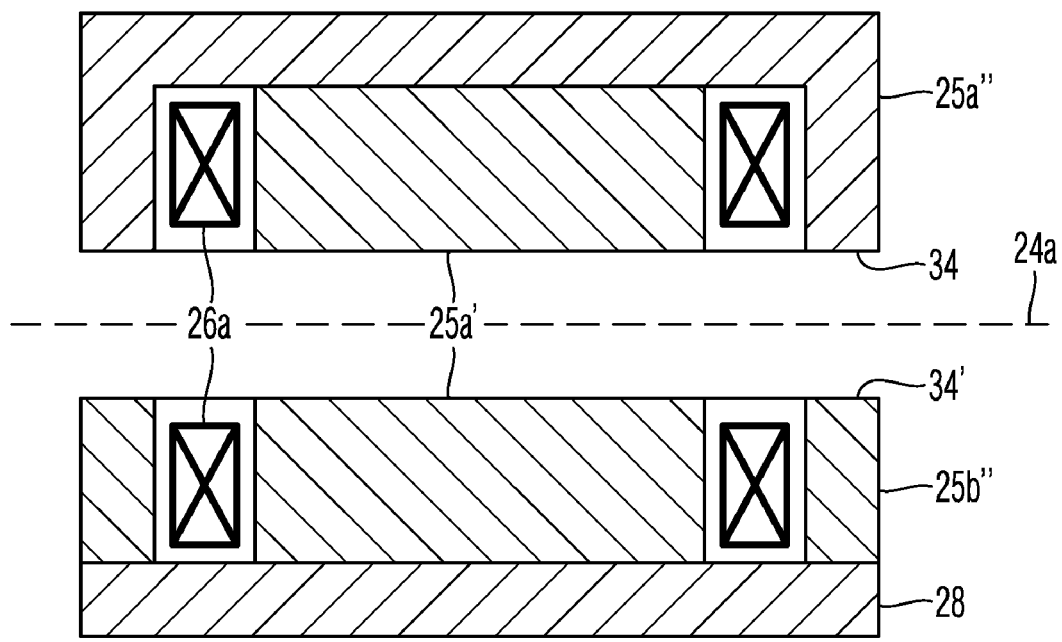
FIG. 4 shows schematically two other possible magnet and coil arrangements.

FIG. 4 illustrates two alternative structures of the pole shoes, wherein functionally corresponding components bear like numerals as above, but with subscript small letters:

In the upper part of this drawing, a bowl-shaped pole plate 25a" with an island pole 25a' is shown, between which the coil 26a is arranged. The surface of the pole plate is labeled 34. The pole plate 25a" and the island pole 25a' are assembled with one another such that between them, a sufficient magnetic connection is provided, and together they form the pole shoe. Similarly, in the lower part of FIG. 4 a variant is shown, in which the pole shoe is formed by an island pole 25a', a ring-shaped pole plate 25b" and a back plate 28, between which the coil 26 is located, as before.

Figure 5A:
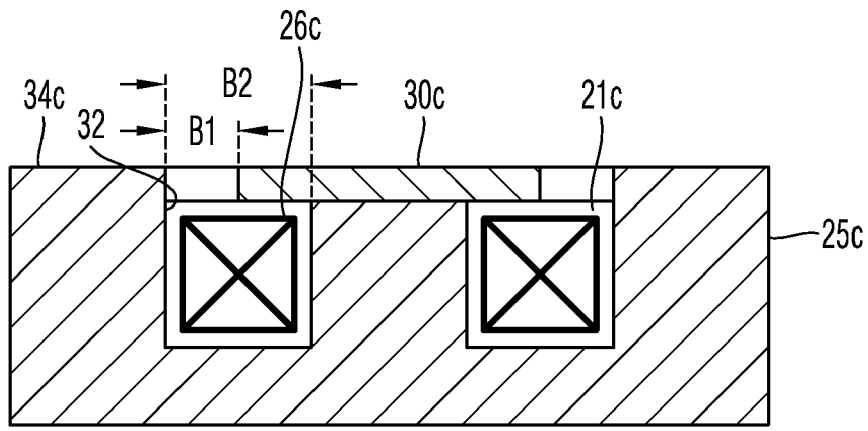
FIG. 5a shows schematically a magnet arrangement for a particle optical device according to an embodiment.

In FIG. 5a, the pole plate 25c has a pole lid 30c in its central portion, the pole lid partly covering the coil trench 21c from the radially inward side, such that only the outer wall 32 of the trench is formed by a single piece of the pole plate 25c. Thereby, the width B1 of the trench at the surface 34c of the pole plate 30c is less than the width B2 of the trench below the surface 34c. The width B1 as well as B2 may vary along the circumference of the poles.

Figure 5B:
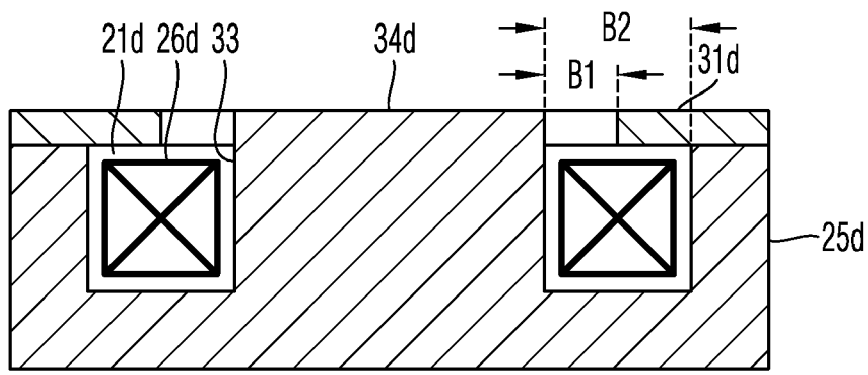

Analogously, in FIG. 5b the pole plate 25d has, in its peripheral region, a ring-shaped pole lid 31d partly covering the coil trench 21d from the radially outward side, so that only the inner wall 33 of the trench is formed from a single piece of the pole plate 25d. Thereby, the width B1 of the trench at the surface 34d of the pole plate 30d is again less than the width B2 of the trench below the surface 34d. The width B1 as well as B2 may again vary along the circumference of the poles.

Figure 5C:
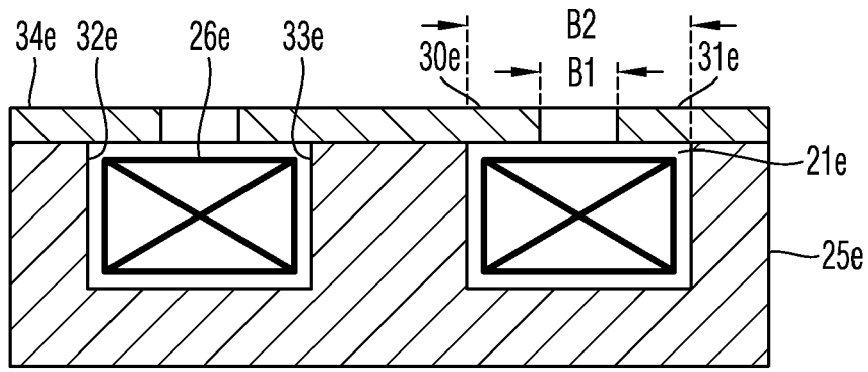
FIG. 5c shows schematically a similar magnet arrangement as the ones of FIGS. 5a and 5b.

In FIG. 5c, the modifications according to FIGS. 5a and 5b are combined: The pole plate 25e has a ring-shaped pole lid 31e in its peripheral region, as well as a pole lid 30e in its central portion, together partly covering the coil trench 21d from the radially inward and outward sides, so that neither the inner wall 33e nor the outer wall 32e of the trench is formed from a single piece of the pole plate 25e. Thereby, the width B1 of the trench at the surface 34e of the pole plate 30e is more reduced compared with the width B2 of the trench below the surface 34e. The width B1 as well as B2 may again vary along the circumference of the poles.

Figure 6A:
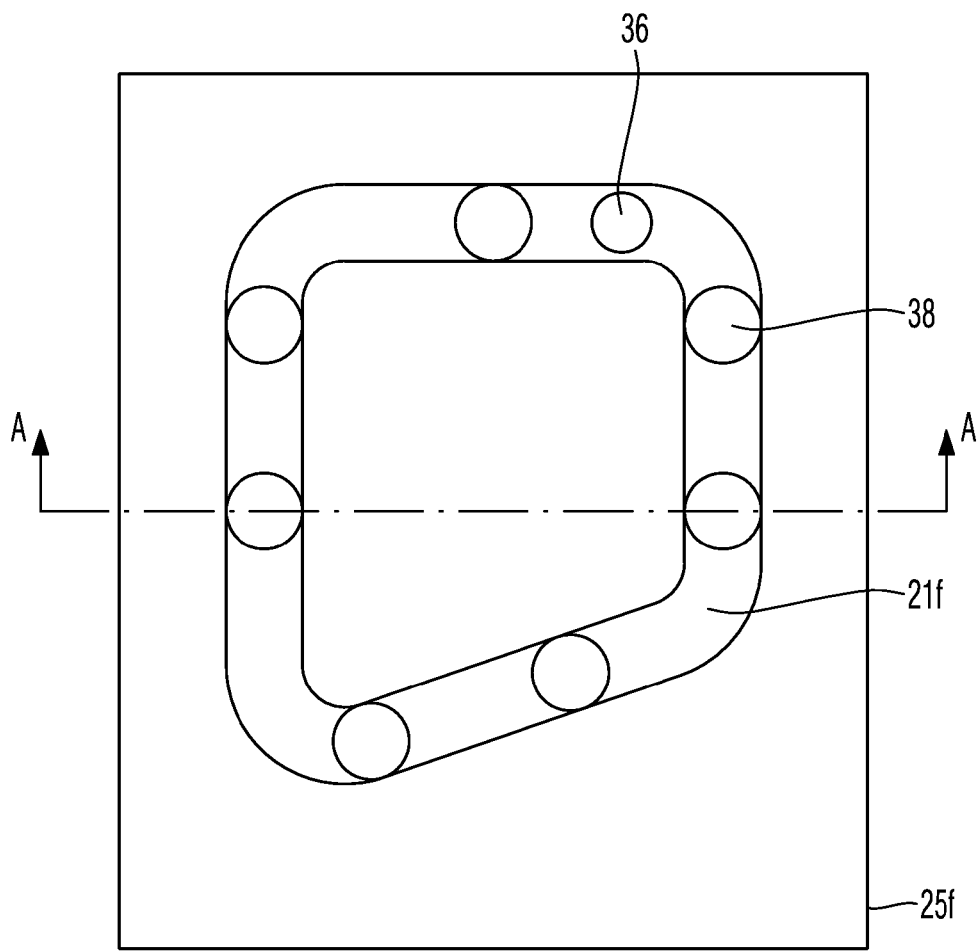
FIG. 6a shows schematically a top view of a magnet arrangement for a particle optical device according to an embodiment.

In the top view according to FIG. 6a, it is shown how, in addition to a lead-through 36 for the coil wire terminal, plural through holes 38 for pillars of a coil mount (see FIG. 6b) are distributed in the bottom of the coil trench 21f. The number of these through holes may e.g. vary between 3 and 9, or between 5 and 7.

Figure 6B:
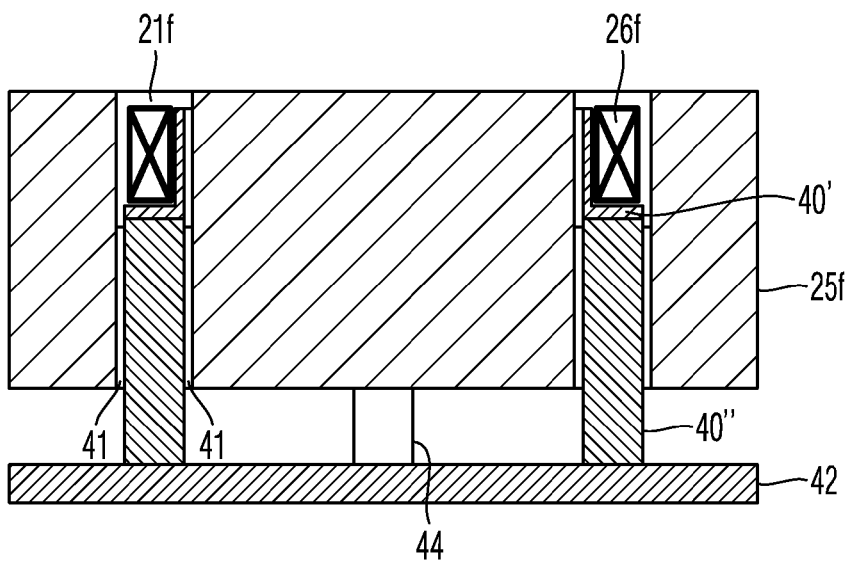
FIG. 6b shows schematically a cross sectional view to the top view of FIG. 6a along the line A-A.
Figure 7:
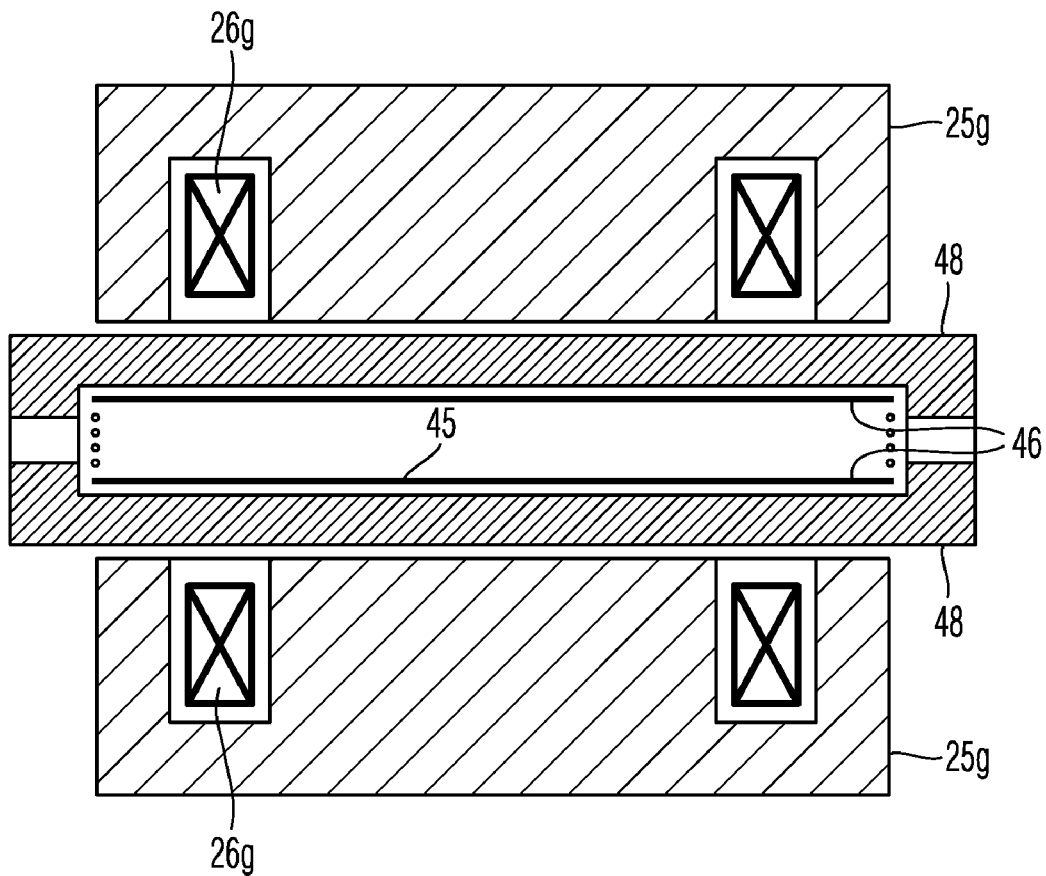
FIG. 7 shows a magnet arrangement for a particle optical device according to an embodiment.

It will become evident from the corresponding side view according to FIG. 6b, that the coil wires 26f are mounted on a ring-shaped coil mount 40', or a mount forming a substantially closed ring, having e.g. an L-shaped profile. This ring 40' is itself mounted on top of several pillars 40" made of a material well conducting heat, e.g. copper or aluminum. A gap 41 is provided between the coil mount 40' and the pillars 40", on the one hand, and the pole plate 25f on the other hand. The gap 41 presents a bar to direct flow of heat to the pole plate 25f. The heat is conducted via the pillars 40" to a common, e.g. plate-like base 42. It is also envisaged to provide active cooling devices (not shown), e.g. water or air cooling, or a Peltier element. The arrangement for mounting the coils 40', 40", 42 is held in place in its position relative to the pole plate 25f by a heat-isolating spacer 44.

The modifications mentioned above relate to the plate or trench geometry in a wider sense. Independently from, or in combination with, the modifications already mentioned, the following embodiments relate to the electrical configuration: According to FIG. 7, a double layer 46 of an electrically conductive, but non-magnetic material, e.g. a thin copper or gold layer, is provided between the pole plates 25g, exemplarily shown here in the basic version of FIG. 3. An upper limit for the tolerable magnetic susceptibility of this material is $\mu_r < 1.01$. The material layer shall further be sufficiently electrically conductive such as to not accumulate electric charges. In the example according to FIG. 7, the electrically conductive layers 46, between which the beam of particles passes through, are each supported by an isolating layer 48 substantially or entirely filling the space between the layers 46 and the respective adjacent pole plate 25g. The isolating layers 48 may be formed monolithically, with only the holes for the ingoing and outgoing particle beams are provided; such a configuration obviates protective measures otherwise involved due to the high voltage to be applied to the double layer 46 and the pole plates 25g. Herein, the isolator may be formed by hollowing out a massive block to form a so-called beam box. Alternatively, the hollow block may be constructed directly in the desired shape e.g. by Rapid Prototyping. In both cases, surface pairs are avoided which would be unavoidable e.g. if several parts would be assembled by screwing together, and which might provide electrical breakthrough paths. The layers 46, together with head-on apertures transmitting the particle beam, form the beam box 45, within which the particles are at a defined electrical potential.

Figure 8:
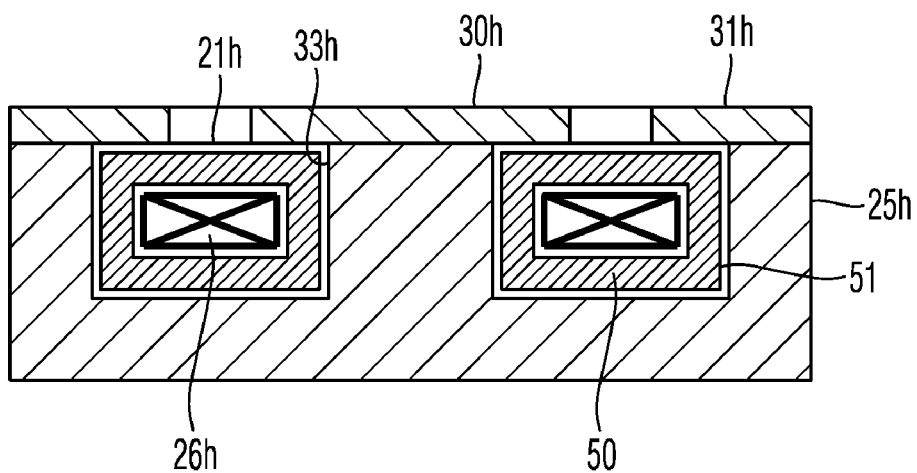
FIG. 8 shows schematically a magnet arrangement for a particle optical device according to an embodiment.

In FIG. 8, a variant is shown in which the coil winding 26h is surrounded as a whole by an electrically and thermally isolating layer 50, such that the latter occupies substantially the entire space in the coil trench 21h left by the coil winding 26h. In this example, the pole plate geometry according to FIG. 5c is taken as basis, in order to have available as much space as possible for the isolation, and to at the same time provide an as large as possible current conductor cross section for the coil wires 46h. Other pole plate types than those with a ring-shaped pole lid 31h and an island-like pole lid 30h are also conceivable. In this arrangement, the coil may be provided at a different potential than the pole plate; furthermore, the heat transfer is reduced. The fact that the pole plate does not serve as a heat sink in this embodiment, and that the coils heat up more as a consequence, is not critical in respect of the constancy and precision of the magnetic field at least as long as a tolerance gap 51 remains between the isolation 50 and the wall 33h of the coil trench 21h, of the isolation 50 is compressible. In this embodiment, the coil itself dissipates the major part of the heat generated in operation, via the coil wires.

Figure 9:
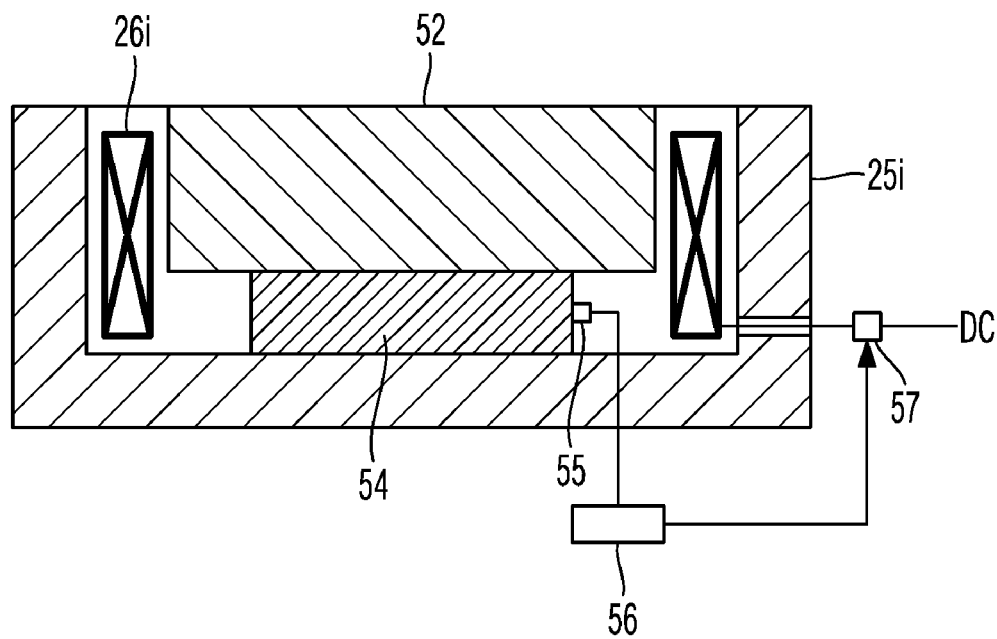
FIG. 9 shows schematically a magnet arrangement for a particle optical device according to an embodiment.

A further possibility is shown in FIG. 9: Herein, a permanent magnet 554 is arranged below an island pole 52, namely a plate made of a magnetic material, which at its periphery defines the coil trench. The permanent magnet provides the larger part of the magnetic flow involved. The coil wires 46h in operation carry considerably less current than in the examples without a permanent magnet discussed above at the same magnetic field, because they provide only a minor part of the total magnetic field strength. The permanent magnet 54 cannot be provided with an exact magnetic field strength, and furthermore its field depends—albeit only a little—from the temperature. Therefore, in this example, a temperature sensor 55 is provided, the output signal of which is used to adjust the power supply voltage DC of the coils 26i by a controller 56 and a regulator 57, such that field variations are compensated. A power supply for the coils is also provided in the embodiments described previously; in addition, a controller may likewise be provided in each of these embodiments.

To summarize, the disclosure provides systems with which the heat generation of the coils and/or the heat transfer from the coils into the pole plates may, in embodiments, be reduced and/or stabilized. The skilled person will conceive of variations to the embodiments presented above, which variations are nevertheless covered by the appended claims.

What is claimed is:

1. A particle optical apparatus, comprising:
   a particle source configured to generate at least one beam of charged particles;
   a magnet arrangement comprising two pole plates, each of the two pole plates having trenches, and the two poles being spaced apart from one another such that, during operation of the particle optical apparatus, the at least one beam of charged particles passes through the two pole plates; and
   coil wires arranged in the trenches of the two pole plates, wherein at least one trench, when viewed in a cross section transverse to an extension direction of the trench, has a smaller width in a region at a surface of the pole plate, than in a region arranged at a distance from the surface of the pole plate.

2. The particle optical apparatus according to claim 1, wherein the width of the at least one trench in the region arranged at the distance from the surface of the pole plate is at least 1.5 times as large as the width of the at least one trench at the surface of the pole plate.

3. The particle optical apparatus according to claim 1, wherein at least one pole plate comprises a dismountable piece defining the width of the trench in the region of the surface.

4. The particle optical apparatus according to claim 3, wherein, for at least one of the pole plates, a wall of a trench extending to the surface of the at least one pole plate is formed by an integral piece of the pole plate.

5. The particle optical apparatus according to claim 1, further comprising a coil support supporting the coil wires, wherein a gap is provided between the coil support and at least one pole plate.

6. A particle optical apparatus, comprising:
   a particle source configured to generate at least one beam of charged particles;
   a magnet arrangement comprising two pole plates, each of the two pole plates having trenches, and the two pole plates being spaced apart from one another such that, during use of the particle optical apparatus, the at least one beam of charged particles passes through the pole plates;
   coil wires arranged in the trenches; and
   a coil support supporting the coil wires,
   wherein a gap is provided between the coil support and at least one of the pole plates.

7. The particle optical apparatus according to claim 5, wherein the gap completely surrounds the coil support.

8. The particle optical apparatus according to claim 5, further comprising a cooling device in thermal communication with the coil support.

9. The particle optical apparatus according to claim 5, wherein the coil support comprises at least one pillar extending through a hole provided in the at least one pole plate and protruding from a back face of the pole plate opposite the surface of the at least one pole plate.

10. The particle optical apparatus according to claim 9, wherein the coil support comprises a plurality of pillars and a base, wherein the plurality of pillars are commonly supported by the base.

11. The particle optical apparatus according to claim 5, wherein the coil support includes a closed support ring onto which the coil wires are wound.

12. The particle optical apparatus according to claim 1, further comprising two layers of an electrically conductive and nonmagnetic material arranged between the two pole plates, the two layer being configured so that, during use of the particle optical apparatus, the two layers and extend on both sides of the at least one beam of charged particles.

13. A particle optical apparatus, comprising:
   a particle source configured to generate at least one beam of charged particles;
   a magnet arrangement comprising two pole plates, each of the two pole plates having trenches, and the two pole plates being spaced apart from one another such that, during use of the particle optical apparatus, the at least one beam of charged particles passes through the pole plates;
   coil wires arranged in the trenches; and
   two layers of electrically conductive but nonmagnetic material arranged between the two pole plates, the two layers extending on both sides of the at least one beam of charged particles.

14. The particle optical apparatus according to claim 13, further comprising two layers of an electrically isolating material, each layer of electrically isolating material being between a corresponding pole plate and a corresponding layer of the electrically conductive and nonmagnetic material.

15. The particle optical apparatus according to claim 14, wherein each layer of the electrically isolating material is configured as a support for its corresponding layer of the electrically conductive and nonmagnetic material.

16. The particle optical apparatus according to claim 1, further comprising at least one permanent magnet for each one of the coils.

17. The particle optical apparatus according to claim 1, further comprising:
   at least one permanent magnet for each one of the coils.

18. The particle optical apparatus according to claim 17, wherein an island pole is arranged between each of the permanent magnets and a corresponding opposite pole plate.

19. The particle optical apparatus according to claim 17, wherein, during use of the particle optical apparatus, the magnetic field provided by the coils is at most the same as the magnetic field provided by the permanent magnet.

20. The particle optical apparatus according to claim 19, wherein, during use of the particle optical apparatus, the magnetic field provided by the coils is at most 10% of the magnetic field provided by the permanent magnet.

21. The particle optical apparatus according to claim 17, further comprising a controller configured to compensate, via the coils, a variation in time of the magnetic field provided by the permanent magnets.

22. The particle optical apparatus according to claim 21, wherein the controller comprises a temperature measuring device.

23. The particle optical apparatus according to claim 1, wherein the coil wires are commonly ensheathed by an electrically and thermally isolating material, and wherein the pole plates are at a higher electric potential than the coils.

24. The particle optical apparatus according to claim 1, further comprising:
- an electrically and thermally isolating material that commonly ensheaths the coil wires,
- wherein, during use of the particle optical apparatus, the pole plates are at a higher electric potential than the coils.

25. The particle optical apparatus according to claim 1, wherein the pole plates are made of an iron-nickel-alloy.

26. The particle optical apparatus according to claim 1, wherein the coil trenches are milled into the pole plates.

* * * * *

UNITED STATES PATENT AND TRADEMARK OFFICE
CERTIFICATE OF CORRECTION

| | | |
|---|---|---|
| PATENT NO. | : 8,063,364 B2 | Page 1 of 1 |
| APPLICATION NO. | : 12/644760 | |
| DATED | : November 22, 2011 | |
| INVENTOR(S) | : Preikszas et al. | |

It is certified that error appears in the above-identified patent and that said Letters Patent is hereby corrected as shown below:

Column 5, Line 19, delete "81." insert --8a--.

Signed and Sealed this
Seventeenth Day of January, 2012

David J. Kappos
*Director of the United States Patent and Trademark Office*